United States Patent [19]
Kammiller

[11] Patent Number: 4,584,595
[45] Date of Patent: Apr. 22, 1986

[54] ARRANGEMENT OF FIELD EFFECT TRANSISTORS FOR OPERATION IN THE SWITCHED MODE AT HIGH FREQUENCY

[75] Inventor: Neil A. Kammiller, Lakewood, Ohio

[73] Assignee: Reliance Electric Company, Cleveland, Ohio

[21] Appl. No.: 699,034

[22] Filed: Feb. 7, 1985

[51] Int. Cl.⁴ .................. H01L 27/02; H01L 27/10; H01L 29/50
[52] U.S. Cl. ........................... 357/41; 357/68; 357/45
[58] Field of Search ................ 357/68, 41, 45

[56] References Cited
U.S. PATENT DOCUMENTS
4,529,999 4/1985 Bender ........................... 357/68

FOREIGN PATENT DOCUMENTS
0935710 9/1963 United Kingdom ............ 357/68

Primary Examiner—Martin H. Edlow
Assistant Examiner—Terri M. Henn
Attorney, Agent, or Firm—Michael M. Rickin

[57] ABSTRACT

A circuit arrangement for FETs connected in parallel. In the arrangement the same electrode of N FETs (N>1) is connected by associated metallic conductors to a central conductor. A further metallic conductor is also connected to the central conductor. The shape of the central conductor is such that the FETs are mechanically equidistant from the connection of the further conductor. This equalizes the fall times between the FETs without the need to add any physical inductors to the circuit.

12 Claims, 6 Drawing Figures

ARRANGEMENT OF FIELD EFFECT TRANSISTORS FOR OPERATION IN THE SWITCHED MODE AT HIGH FREQUENCY

BACKGROUND OF THE INVENTION

1. Field of the Invention

This invention relates to the use of field effect transistors (FETs) in power supplies and more particularly to an arrangement of FETs for use in high frequency switching type power supplies.

2. Description of the Prior Art

In the past, switching type power supplies operated at relatively low frequencies such as 60 Hz. This low frequency of operation had a number of drawbacks, among which were the large size of the power transformers and the generation of audible noise.

In order to overcome the above drawbacks, it has become common in the past several years for switching type power supplies to be operated at frequencies typically in the range of 20 to 40 KHz. Operation at such frequencies allowed the size of the power transformer to be reduced and did not give rise to noise in the audible range. Switching power supplies operating at such frequencies have typically used bipolar transistors for the switching elements.

A further reduction in the size of the power transformer can be achieved by switching the power handling devices of the supply at a still higher frequency, as for example, 200 KHz. Bipolar transistors have certain characteristics which make their use in the switched mode undesirable at such frequencies.

One of these undesirable characteristics is that the storage time of such devices is typically in the order of one microsecond. At a switching frequency of 20 and 40 KHz this storage time is relatively small as compared to the time between switching pulses. At switching frequency of 200 KHz the storage time becomes a significant portion of the time between switching pulses. FETs do not have this undesirable characteristic.

Another undesirable characteristic of bipolar transistors is that such devices have a relatively small safe operating area when compared to FETs. In switching power supply applications, a bipolar transistor is typically operated at one-half of its rated current. For the same application a FET will be typically operated at one-sixth of its rated current. The FET, has therefore, a relatively large safe operating area as compared to a bipolar transistor and when operated in the switched mode, FETs are more efficient than bipolar transistors.

Finally, a power supply switching at 200 KHz is much more sensitive to parasitic elements (particularly inductances) than a supply switched at 20 to 40 KHz. At a 200 KHz switching frequency there are relatively fast rates of change of current and voltage which can give rise to large disturbances in the voltage and current, respectively, as a result of the parasitic elements. The drive circuit for FETs is generally more adaptable to such elements as compared to the same circuit for bipolar transistors. Therefore, the use of FETs at such switching frequencies is desired.

In using FETs for power switching it is often necessary to connect a number of FETs in parallel in order to handle the current associated with the supply. FET circuits have associated therewith stray inductance and resistance and the FETs have unequal delay and fall times. In typical prior art arrangements of FETs in parallel, the stray inductances and resistances are not the same for each FET. Therefore, when a number of FETs are placed in parallel, the unequal stray inductances, delay and fall times will cause different rates of change for the current in each FET for a given power pulse and the unequal stray resistances will cause different current levels in each FET for various portions of the power pulse. Thus, it is desirable to find an arrangement of FETs which will allow a number of FETs to be placed in parallel and also minimize the undesirable effects of the stray inductances and resistances, delay and fall times described above.

SUMMARY OF THE INVENTION

According to the present invention there is disclosed a circuit arrangment for N FETs, where N is a number greater than one. The arrangement also includes N+1 conductors, N of which are associated with the N FETs. One end of the N conductors are each connected to the same electrode of the associated one of the FETs.

The arrangement also includes a central metallic conductor which has a predetermined shape. The other end of the N conductors and one end of the Nth+1 conductors are each connected to the central conductor. The shape is such that each of the N FETs are mechanically equidistant from the Nth+1 conductor one end.

DESCRIPTION OF THE PREFERRED EMBODIMENT

Figure 1:
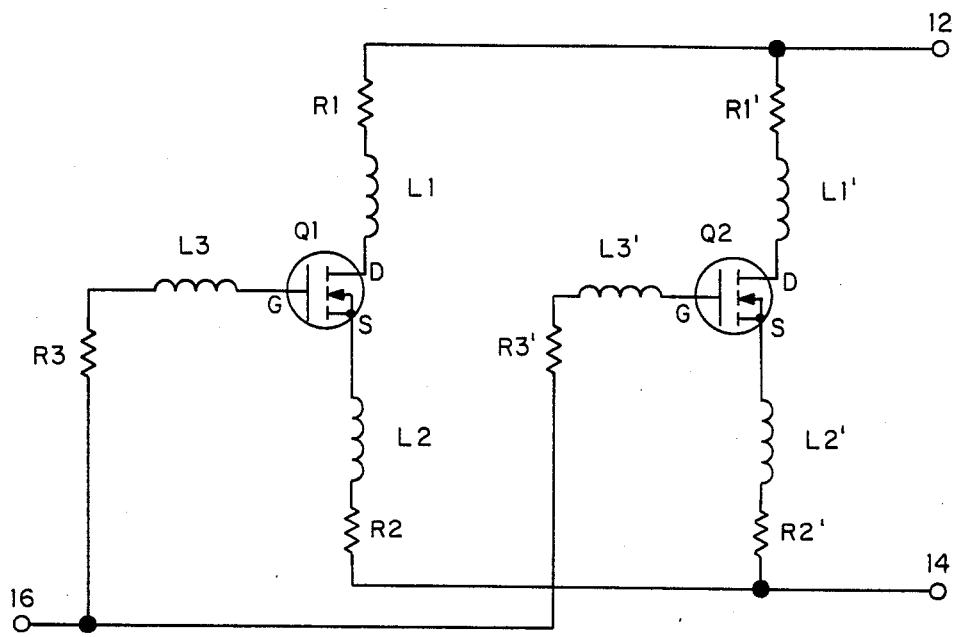
FIG. 1 is a circuit diagram showing two FETs connected in parallel.

Referring to FIG. 1 there is shown the parallel connection of two N channel field effect transistors (FETs), Q1 and Q2. Each FET is made up of a gate electrode (designated as G), a drain electrode (designated as D) and a source electrode (designated as S) as shown in FIG. 1. The drain electrodes of Q1 and Q2 are connected to a a common terminal 12. The source electrodes of Q1 and Q2 are connected to common terminal 14 and the gate electrodes of both FETs are connected to a common terminal 16.

The FETs Q1 and Q2 are connected in parallel as they are to be used as part of the current handling circuitry of a high frequency switched mode type supply. The signal to switch Q1 and Q2 on and off appears at the gate electrode. The output power appears at terminals 12 and 14. The frequency at which the FETs of such a supply would be switched is typically in the order of 200 KHz.

It is desired that the FETs Q1 and Q2 function in a substantially uniform and predictable manner in response to each switching pulse which appears on the gate electrode. The result of placing FETs in parallel is, however, that the stray inductances and resistances, delay and fall times associated with the electrodes of each FET, cause Q1 and Q2 not to function in the desired manner. The stray inductance and resistance associated with the drain electrode are designed as L1 and R1 for Q1 and L1' and R1' for Q2. The stray inductance and resistance associated with the source electrode are designated as L2 and R2 for Q1 and L2' and R2' for Q2. The stray inductance and resistance associated with the gate electrode are designated as L3 and R3 for Q1 and L3' and R3' for Q2. To achieve the desired operation of Q1 and Q2 it is necessary for:

$$L1 = L1'$$

$$R1 = R1'$$

$$L2 = L2'$$

$$R2 = R2'$$

$$L3 = L3'$$

$$R3 = R3',$$

that is, the stray inductance and resistance associated with the drain, source and gate electrodes of Q1 must be made essentially equal, respectively, to the stray inductance and resistance associated with the drain, source and gate electrodes of Q2.

While FIG. 1 has shown only the parallel connection of two N channel FETs it should be appreciated that the matching of stray inductance and resistance described above would be desired no matter how many such FETs are connected in parallel. It should also be appreciated that the matching described above would be desired if the FETs connected in parallel were of the P channel type rather than the N channel devices shown in FIG. 1.

The reason why it is desired that FETs connected in parallel function uniformly in response to each switching pulse which appears at the gate electrode relates to the turn off response of the FETs. When FETs connected in parallel are turned off, it is desired that they all turn off at the same time. The power current being provided by the FETs when they are on will not fall until all of the FETs are switched off. The FETs, however, have slightly different delay times from each other. This causes the current flowing in them when they are turned off to fall at different rates, i.e., some of the paralleled FETs will turn off sooner than others. This leaves less and less of the paralleled FETs to carry the current load. As it is inductance which principally affects the rate of current fall at a FET switch at turn off, it was recognized in the past that adding sufficient inductance in series with each FET would tend to equalize the turn off times of the FETs. The ease with which such inductances are added and the uniformity of the inductance depends on the manner in which the FETs are connected in parallel, i.e., their geometrical arrangement.

It should be appreciated that the desire to have all of the paralleled FETs turn off at the same time arises as a result of the relatively fast rate that the FET current falls at turn off. That is at turn off the rate of change of FET current with time, di/dt, is fast. This same problem does not occur at turn on as the current in each FET builds at a controlled and relatively slow rate.

Figure 2:
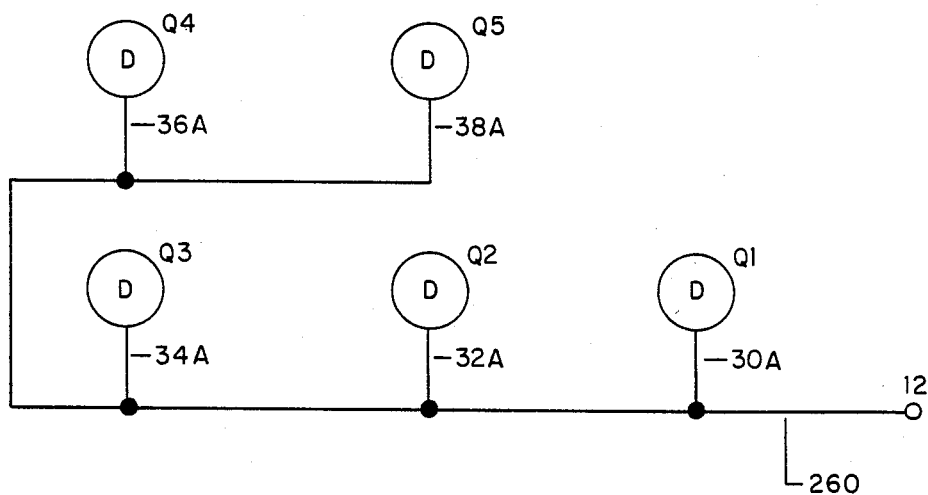
FIG. 2 is a diagram of a rectangular geometrical arrangement by which five FETs are connected in parallel.

Referring now to FIG. 2, there is shown a geometrical arrangement 10 of five FETs Q1, Q2, Q3, Q4 and Q5 which are connected in parallel in an essentially rectangular layout. For ease of illustration each of the FETs are shown as circles and only the D electrode of each FET has been shown.

Terminal 12 is connected to the D electrode of the FETs by a metallic conductor 26a and by individual metallic conductors 30a, 32a, 34a, 36a and 38a associated with each of the FETs Q1, Q2, Q3, Q4, and Q5, respectively. While not shown, each of the S and G electrodes of the FETs are connected to terminals 14 and 16, respectively, by a main metallic conductor 26b, 26c and individual metallic conductors 30b, 32b, 34b, 36b and 38b; and 30c 32c, 34c, 36c and 38c associated with each of the S and G electrodes of each of the FETs Q1, Q2, Q3, Q4 and Q5, respectively.

In arrangement 10 the D electrodes of the FETs are all connected to terminal 12 by conductors of differing lengths. In a similar manner, the S and G electrodes of the FETs are all connected to their repsective terminals 14 and 16 by electrical conductors of differing length. Therefore, the metallic conductors of arrangement 10 do not introduce equal inductances into the same terminals of each of the FETs. In arrangement 10 equality of inductance for each of the D, S, G electrodes for all of the FETs can only be achieved by adding physical inductors having different values of inductance into each of the conductors. It is clear that arrangement 10 does not by itself provide the desired result of equalizing the turn off time of the five paralleled FETs.

Figure 3:
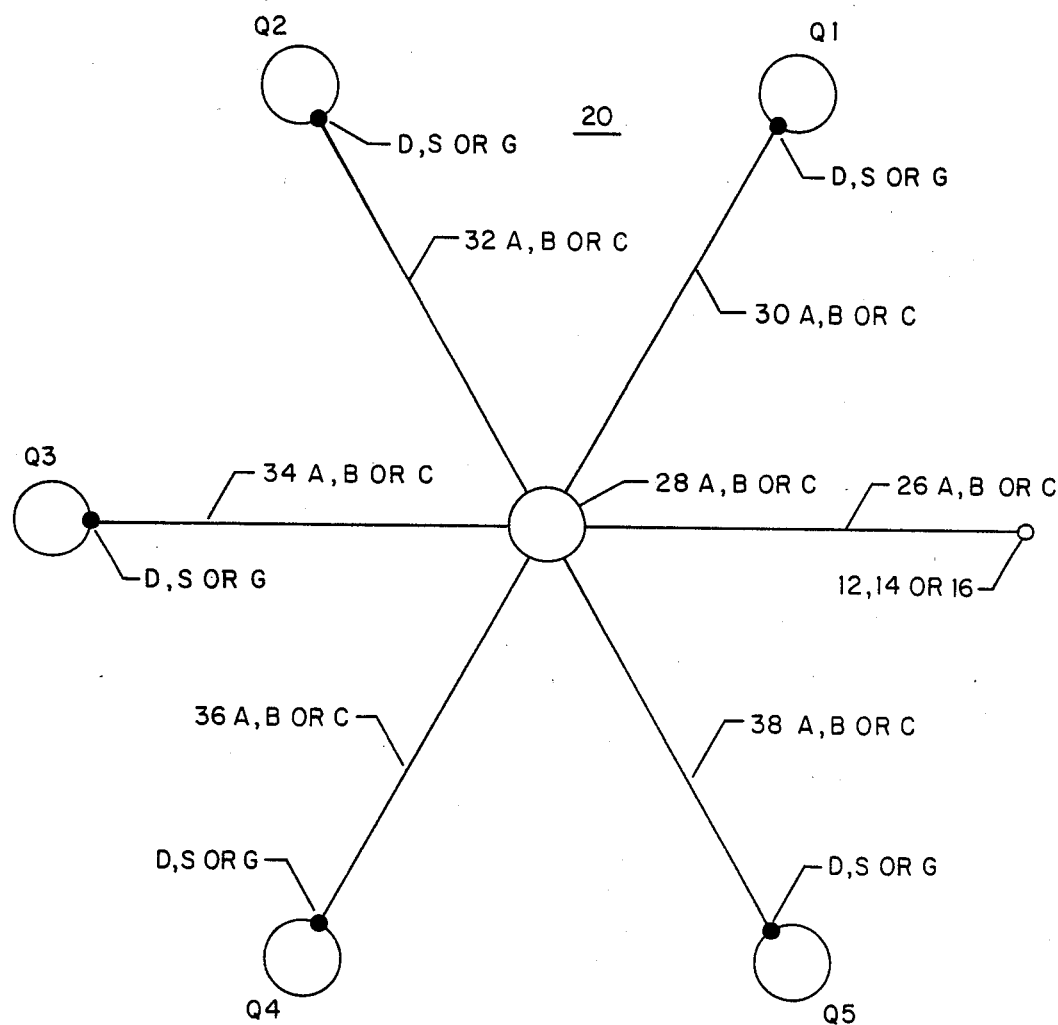
FIG. 3 is a diagram of the geometrical arrangement in accordance with the present invention for connecting a small number of FETs in parallel.

I have found that in order for the stray inductance and resistance associated with the drain, source and gate electrode of one FET to become essentially equal to the corresponding inductance and resistance of the other FETs with which it is connected in parallel, that it is necessary for all of the FETs to have their D, S and G electrodes mechanically equidistant from the associated one of terminals 12, 14 or 16. The manner in which a number of FETs are connected in parallel in order that their D, S or G terminals are all mechanically equidistant from the associated one of the corresponding terminals 12, 14 or 16 is shown in the geometrical arrangement 20 of FIG. 3. The mechanical equidistance results in electrical parameter equivalence and will be referred to hereinafter as electrical equidistance. Arrangement 20 is shown in the form of a representational connection diagram for the circumstances wherein the same five FETs Q1, Q2, Q3, Q4 and Q5 of arrangement 10 are connected in parallel. The diagram of FIG. 3 represents the connection of the same electrode in all five FETs to the corresponding terminal. The particular electrode which is represented in FIG. 3 is not of importance, it is rather the manner in which that electrode is connected to the terminal.

Terminal 12, 14 or 16 is connected by the associated one of metallic conductors 26a, b or c to the associated one of essentially circular metallic conductors 28a, b or c. Conductor 26a connects terminal 12 to conductor 28a, conductor 26b connects terminal 14 to conductor 28b and conductor 26c connects terminal 16 to conductors 28c. The corresponding electrodes of the five FETs are arranged with respect to the associated one of circular conductors 28a, b or c such that they are situated at equally spaced locations along the circumference of a circle (not shown) which is concentric with the associated one of conductors 28a, b or c. The associated one of conductors 26a, b or c essentially takes the place of a sixth FET and is therefore situated along the circumference at a location which is halfway between the locations of Q1 and Q5. This arrangement 20 of FETs will be referred to hereinafter as pod.

The connections between the associated electorde of FETs Q1 to Q5 and the associated one of conductors 28a, b or c occur at equally spaced locations along the circumference of conductor 28a, b or c. The D electrode of FET Q1 is connected to associated conductor 28a by metallic conductor 30a. The S electrode of Q1 is connected to associated conductor 28b by metallic conductor 30b and the G electrode of Q1 is connected to associated conductor or 28c by conductor 30c. In a similar manner the metallic conductors 32a, b or c; 34a, b or c; 36a, b or c; and 38a; b or c connect the D, S or G electrodes of FETs Q2 to Q5, respectively, to the associated one of conductors 28a, b or c.

In arrangement 20 all of the D, S and G electrodes of all of the five FETs are electrically equidistant from the associated ones of terminals 12, 14 and 16. The metallic conductors associated with all of the D, S and G electrodes introduce the same inductance inot all of the five FETs. Therefore, the arrangement 20 by itself minimizes any inequality in the fall times of the five paralleled FETs. It is not necessary to add any physical inductors in order to achieve the desired result of equalizing the turn off time of the FETs.

There has been shown in FIG. 3 a geometrical arrangement for FETs connected in parallel which substantially equalizes the fall times between the FETs. Pod 20 is a useful arrangement where a small number of FETs are to be connected in parallel. In some power supply applications it may be necessary, however, to connect a large number of FETs in parallel. No matter how many FETs are connected in parallel it is always desirable that the D, S and G electrodes of all of the paralleled FETs be electrically equidistant from the associated ones of terminals 12, 14 and 16.

Figure 4:
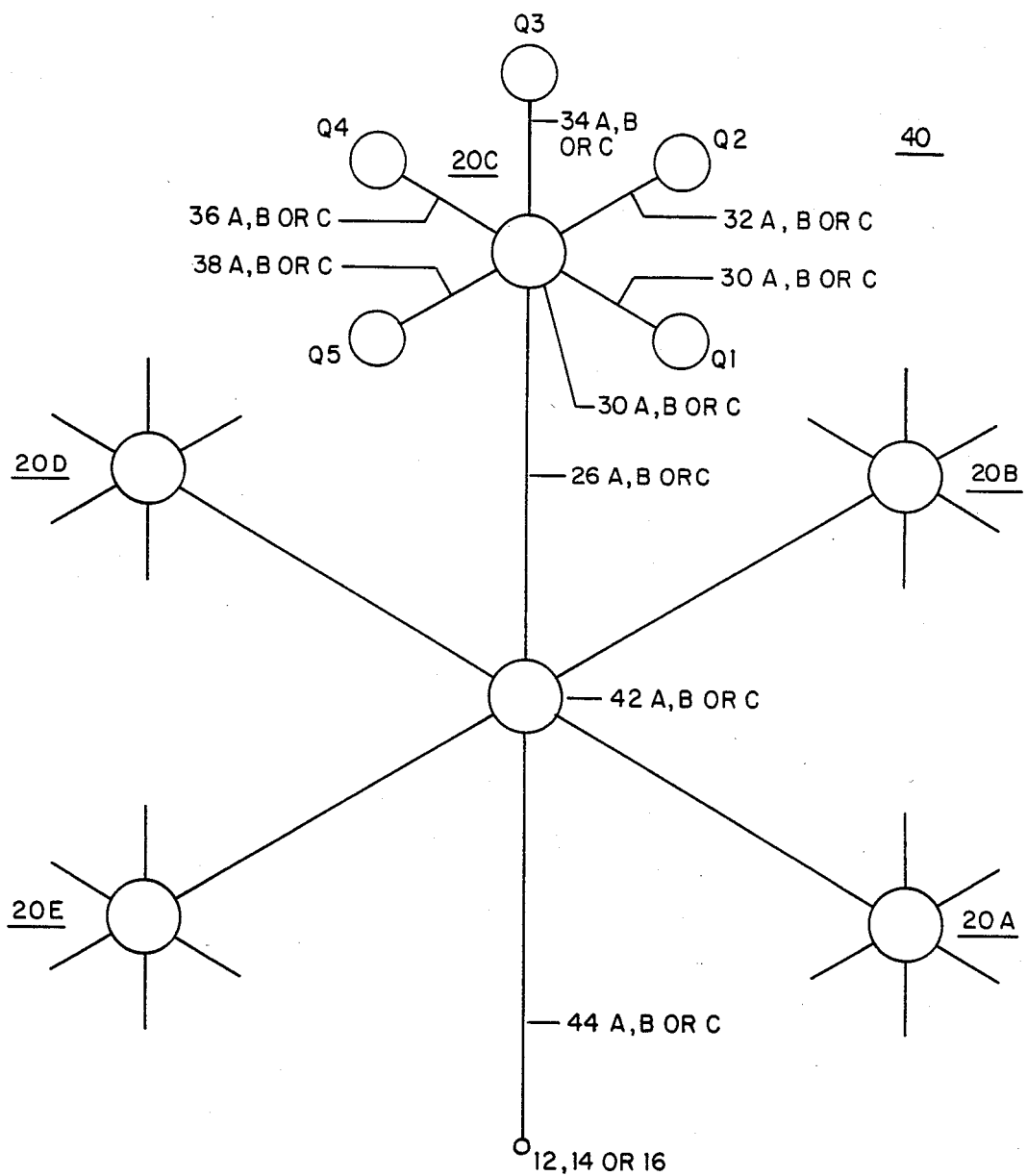
FIG. 4 is a diagram of the geometrical arrangement in accordance with the present invention for connecting a large number of FETs in parallel.

Referring now to FIG. 4 there is shown an arrangement 40 which allows a large number of FETs to be connected in parallel such that the electrodes of all of the FETs ae electrically equidistant from the associated terminal. More particularly there is shown in the arrangement of FIG. 4, 25 FETs connected in parallel. Arrangement 40 will be referred to hereinafter as a cluster.

Cluster 40 is shown in the form of a representational connection diagram for the circumstances wherein five pods each having five FETs are connected in parallel. As can be seen from a comparison of FIGS. 3 and 4, each of the five pods are identical to pod 20 of FIG. 3. For ease of illustration the five FETs Q1, Q2, Q3, Q4 and Q5 of only one of the pods 20c is shown in detail. The other four pods are designed as 20a, 20b, 20d and 20e it being understood that all of the pods are identical to pod 20 of FIG. 3. The diagram of FIG. 4 represents the connection of the same electrode in all of the 25 FETs to the corresponding terminal. The particular electrode which is represented in FIG. 4 is not of importance, it is rather the manner in which that electrode is connected to the terminal.

In pod 20 of FIG. 3 the associated one of the three essentially circular metallic conductors 28a, b or c served as the means by which the associated electrode of each of the five FETs Q1 to Q5 were connected to the associated one of terminals 12, 14 or 16. In cluster 40 the associated one of the three essentially circular metallic conductors 42a, b or c serves as the means by which the associated D, S or G electrodes of the pods 20a, 20b, 20c, 20d and 20e are connected to the associated ones of terminals 12, 14 or 16. More particularly, the associated one of the three essentially circular metallic conductors 42a, b or c are connected to the terminals 12, 14 or 16 by the associated ones of metallic conductors 44a, b or c.

Another way to view cluster 40 is to think of pods 20a, 20b, 20c, 20d and 20e as each being, in effect, one large FET which is actually the parallel combination of five FETs. The five large FETs represented by pods 20a to 20e, then have their D, S or G electrodes connected to terminals 12, 14 or 16 in a manner identical to that shown in FIG. 3 for the five individual FETs Q1 to Q5 of pod 20.

No matter how cluster 40 is viewed all of the D, S and G electrodes of a FET in any one of the pods is electrically equidistant from the other FETs in that pod. Each pod is electricaly equidistant from all other pods. The metallic conductors associated with all of the D, S and G electrodes introduce the same inductance into all of the 25 FETs. Therefore, cluster 40 by itself minimizes any inequality in the fall times of the 25 paralleled FETs. It is not necessary to add any physical inductors in order to achieve the desired result of equalizing the turn off time of the FETs.

There has been shown in FIG. 3 an arrangement 20 by which a small number of FETs may be connected in parallel such that the inequality of fall time can be minimized without adding any external inductors. There has been shown in FIG. 4 an arrangement 40 by which a large number of FETs may be connected in parallel such that the inequality of fall time can be minimized without adding any external inductors.

In accordance with the teachings of my invention even larger numbers of FETs can be connected in parallel such that the inequality in fall time can be minimized without the need to add any external inductors. If each of the pods 20a to 20e of cluster 40 are thought of as being a cluster to which a number of pods are connected then the manner in which even larger numbers of FETs can be so connected becomes evident. The principles of my invention ensure that all of the FETs are electrically equidistant from each other and the associated terminal. It should be appreciated that the numbers of paralleled FETs shown in FIGS. 3 and 4 are meant to be only illustrative of the principles of my invention and that the numbers of paralleled FETs shown in those figures were chosen solely for purposes of illustration. It should also be appreciated that while FIGS. 3 and 4 have shown only two dimensional arrangements of FETs, that the teachings of my invention allow for FETs to be arranged in three dimensions. A three dimensional arrangement may be desirable where a very number of FETs are to be connected in parallel.

Figure 5A:
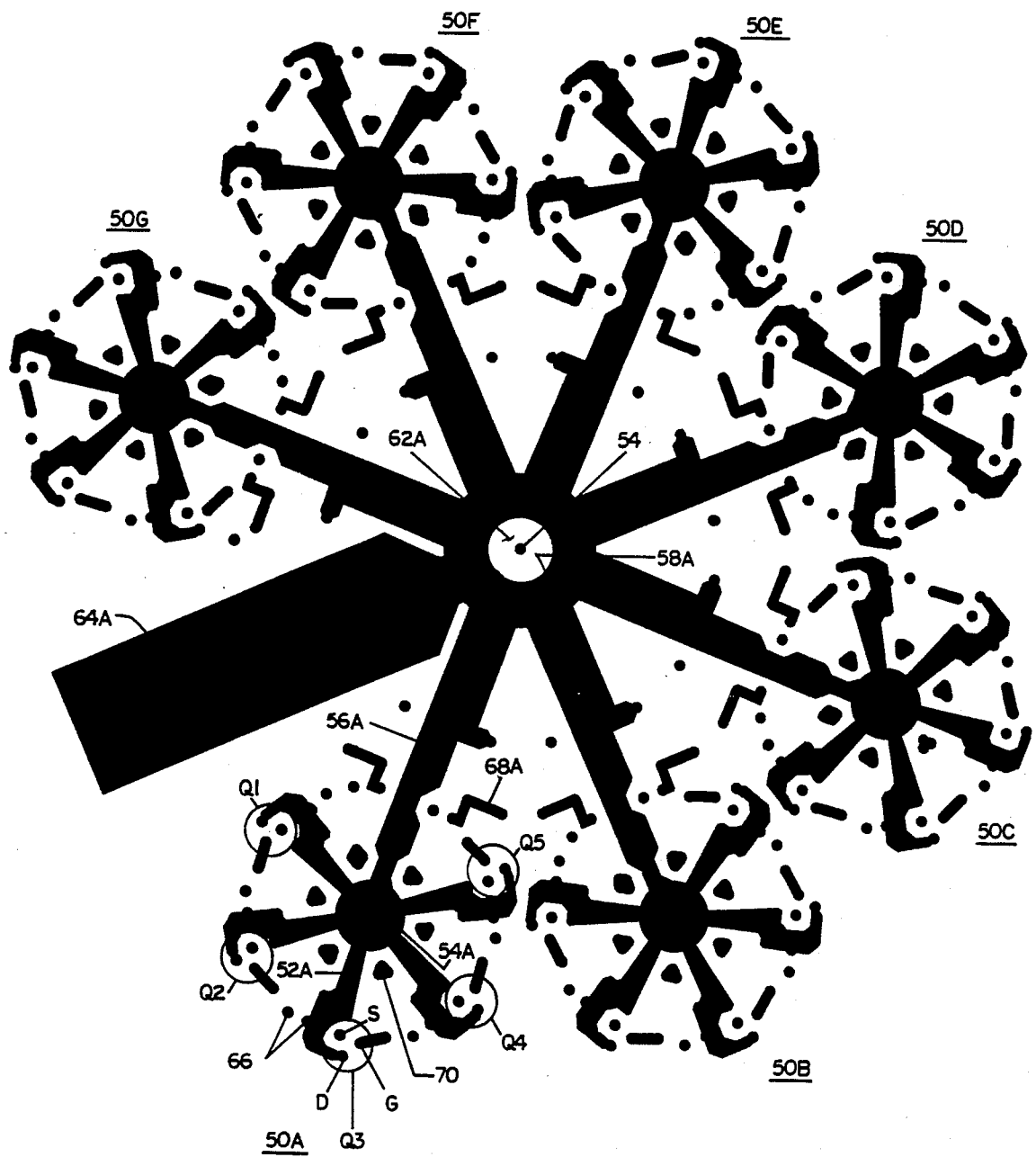
FIGS. 5a and 5b are part of the tracings for opposite sides of a printed circuit board for use in a power supply in which a large number of FETs are connected in parallel in accordance with the present invention.

In FIGS. 3 and 4 there has been shown arrangements by which a small and a large number of FETs may be connected in parallel in accordance with the teachings of my invention. Referring now to FIG. 5a, there is shown the tracing i.e. the conductors for one side of a printed circuit board for use in a switching power supply of the type which uses FETs in a half bridge arrangement. As this supply provides at its output a relatively large current it is necessary for each of the two power switches of the half bridge to have a very large number of FETs connected in parallel. In particular, the tracing shown in FIG. 5a is for one of the two power switches of the half bridge, it being understood that the tracing for the other power switch of the half bridge is essentially identical.

In the tracing of FIG. 5a, 35 FETs are connected in parallel in the form of seven identical pods 50a to 50g each being made up of five FETs. The seven pods form a cluster 60. As each of pods 50a to 50g are identical only one (50a) will be described in detail. Pod 50a includes five FETs designated as Q1 to Q5. For ease of illustration the D, S and G electrodes of only one of the FETs, Q3, has been identified. The D, S and G electrodes of the other FETs in the pod are readily identifiable. The tracing shown in FIG. 5a is that which connects the D electrode of the associated FET to the terminal 12 (not shown).

In particular, the D electrode of FET Q3 of pod 50a is connected by metallic conductor 52a to essentially circular metallic conductor 54a. In fact, the D electrode of all the other FETs, Q1, Q2, Q3, Q4, Q5, in the pod are also connected to conductor 54a by associated metallic conductors which are identical to conductor 52a. Metallic conductor 56a then connects circular conductor 54a to essentially circular metallic conductor 58a. Conductor 58a is not solid but has an essentially circular hole 62a cut therein. The need for that hole will be explained hereinafter. Metallic conductor 64a then connects conductor 58a to terminal 12. A comparison of FIG. 5a with FIG. 4 establishes the equivalence of conductors 52a, 54a, 56a, 58a, 64a of FIG. 5a with conductors 34a, 28a, 26a, 42a, 44a, respectively, of FIG. 4.

Figure 5B:
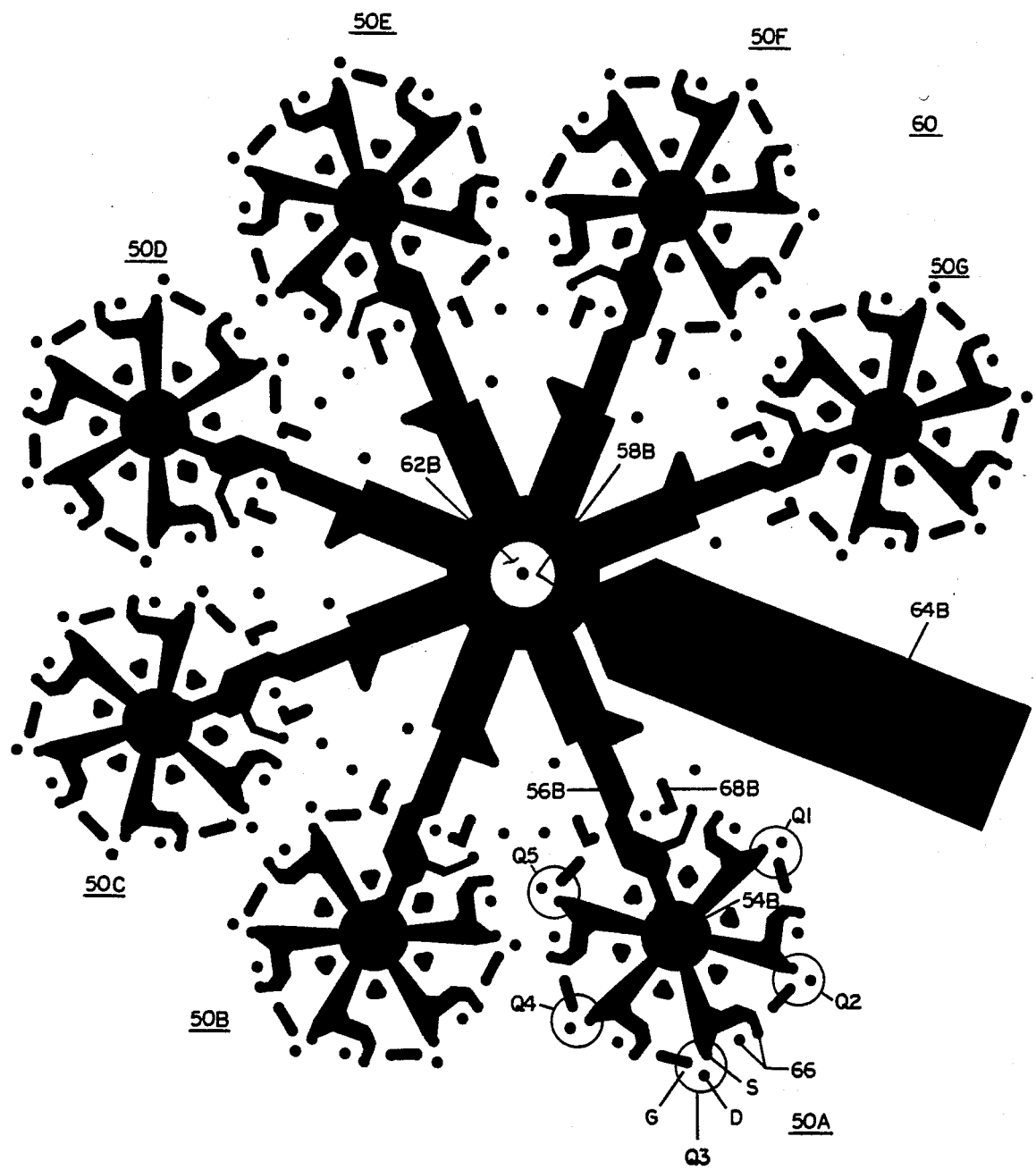

Referring now to FIG. 5b there is shown the tracing which connect the S electrodes of the 35 FETs to terminal 14 (not shown). In particular, the S electrode of FET Q3 of pod 50a is connected by metallic conductor 52b to essentially circular metallic conductor 54b. The S electrode of all of the FETs of pod 50a are also connected to conductor 54b by associated metallic conductors which are identical to conductor 52b. Metallic conductor 56b then connects circular conductor 54b to essentially circular metallic conductor 58b. Conductor 58b is identical to conductor 58a and therefore also has an essentially circular hole 62b cut therein. Metallic conductor 64b then connects conductor 58b to terminal 14. A comparison of FIG. 5b with FIG. 4 establishes the equivalence of conductors 52b, 54b, 56b, 58b, 64b of FIG. 5b with conductors 34b, 28b, 26b, 42b, 44b, repsectively, of FIG. 4.

The tracings of FIGS. 5a and 5b can easily be placed on opposite sides of a double layered board. That is the tracing for the D electrodes connections could be placed on one side of the double layered board and the tracing for the S electrodes connections could be placed on the other side of the board. Tracings similar to those shown in FIGS. 5a and 5b could also be used to connect the G electrodes of the FETs to terminal 16. To have such similar tracings a board having more that two layers would be needed. I have found, however, that it is not necessary to use such a multi-layered board in order that the desired inequality of fall time be minimized.

As described above the tracings for connecting the D and S electrodes connections can be placed on opposite sides of a double layered board. When that is done the holes 62a in the D traces and 62b in the S traces are in alignment. The connections (not shown) to the G electrodes of all of the FETs can then be made by using a suitable type of connector wire such as the type of small coaxial wire manufactured by Uniform Tubes, Inc. of Collegeville, Pa. The coaxial wire which is connected to the G electrodes of the five FETs of pod 50a may be passed through hole 62a/62b for connection to terminal 16. In a similar manner the micro coax connected to the G terminals of the FETs of pods 50b, 50c, 50d, 50e, 50f, 50g may also be passed through the hole for connection to terminal 16. I have found that using small coxial wire in the manner described does not have any substantial effect on the minimization of inequality of fall time as the G electrodes of all of the FETs in each pod are still mechanically equidistant from terminal 16.

As described previously, the tracings of FIGS. 5a and 5b are those used in a power supply of the half bridge type. As is well known, such a supply must also include, in conjuction with each of the FETs, a diode to provide reverse current clamping. The terminals to which the clamping diode is connected is shown in both FIGS. 5a and 5b. For FET Q3 of pod 50a they are designated as 66 collectively in both figures. Such a supply must also include in conjunction with the FETs, one or more voltage clamp capacitors and diodes. In the supply whose arrangement of FETs is illustrated in FIGS. 5a and 5b, there are a capacitor and diode associated with each pod. The capacitor is connected between the contact identified as 68a of pod 50a and conductor 56a (see FIG. 5a). The diode is connected between the contact identified as 68a of pod 50a and conductor 56b (see FIG. 5b).

Such a supply must also include a resistor which is associated with the gate electrode of each of the FETs. This resistor is needed in order that the FETs do not oscillate with each other when they are connected in parallel. For FET Q3 of pod 50a the resistor is connected between the gate electrode and a contact identified as 70. It should be appreciated that the diodes, capacitors and resistors described above form no part of my invention. They are simply circuit elements which, as is well known to those skilled in the art, are typically added to an arrangement of FETs connected in parallel so that they can be used in a switching type power supply of the half bridge type.

There has been described an arrangement by which a small or a large number of FETs can be connected in parallel such that the inequality of fall time can be minimized without adding any external inductors. It should be appreciated that it is the shape of central conductor 28a, b or c which allows the FETs Q1 to Q5 to be connected to the conductor such that they are mechanically equidistant from the associated one of terminals 12, 14 or 16. While conductor 28a, b or c has been shown in FIG. 3 to be a circle it should be appreciated that the shape can be any shape which meets the above requirements. For example, for the five FETs and conductro 26a, b or c shown in that figure the shape may be a hexagon and the circle can be that which is circumscribed aroung the hexagon. The FETs and the conductor 26a, b or c are then connected to the corners of the hexagon.

In addition, the size of the central conductor should be small compared to the length of the radial conductor arms which connect the FETs to the central conductor. It is the radial arms which introduce the greatest part of the inductance which results in the minimization of fall time inequality between the FETs. While the arms must be wide enough to carry the associated current, they must also be long enough to introduce the desired inductance. As is well known the wider the arms become, the less is the inductance they introduce. Also as is well known the thicker the P.C. board becomes the greater is the inductance of the arms.

Ideally, the central conductor could be reduced to a point except for the requirement that it be capable of carrying the current flowing through the circuit. Therefore the central conductor must have some finite area. It should also be apreciated that the central conductor should be centered in the geometry of the FET circuit arrangement. In this manner the central conductor does not favor one FET at the expense of the others. Therefore in FIG. 3, central conductro 28a, b or c should be centered with respect to FETs Q1 to Q5. In the cluster 40 of FIG. 4, central conductor 42a, b or c should be centered with respect to pods 20a to 20e.

While the present invention has been described in connection with a small or large number of FETs connected in parallel, it should be appreciated that the arrangement of my invention may also be used with any semiconductor device wherein it is desired to connect one or more electrodes of that device in a manner such that fall time inequality between devices is minimized without the need to add any external inductors.

It is to be understood that the description of the preferred embodiment is intended to be only illustrative, rather than exhaustive, of the present invention. Those of ordinary skill will be able to make certain additions, deletions, and/or modifications to the embodiment of the disclosed subject matter without departing from the spirit of the invention or its scope, as defined by the appended claims.

What is claimed is:

1. A circuit arrangement for semiconductor devices comprising:
   (a) a first group of N semiconductor devides wherein N is a number greater than one;
   (b) a first group of N+1 metallic conductors, N of which are each associated with a respective one of said N semiconductor devices, one end of each of N of said N+1 conductors being connected to the same electrode of each of said N semiconductor devices; and
   (c) a first central metallic conductor having a predetermined shape, the other end of said N associated conductors and one end of the Nth+1 conductor of said N +1 conductors each being connected to said first central conductor, said shape being such tht each of said N semiconductor devices are mechanically equidistant from said Nth+1 conductor one end.

2. The semiconductor device circuit arrangement of claim 1 wherein the other end of said Nth+1 metallic conductor is connected to a terminal of said circuit arrangement associated with said electrode.

3. The semiconductor device circuit arrangement of claim 1 further comprising a second central metallic conductor having a predetermined shape, the other end of said Nth+1 conductor being connected to said second central conductor.

4. The semiconductor device arrangement of claim 3 further comprising another metallic conductor one end of which is connected to said second central metallic conductor.

5. The semiconductor device arrangement of claim 3 further comprising a secon group of N semiconductor devices, a second group N+1 metallic conductors, N of which are each associated with a respective one of said N semiconductor devices in said second group, one end of each of N of said second group of N+ 1 conductors each being connected to an electrode of each of said second group N semiconductor devices which is the same as said same electrode of said first group of N semiconductor devices, a third central metallic conductor having a predetermined shape which is the same as said first central metallic conductor predetermined shape, the other end of said N associated conductors of said second group and the Nth+1 conductor of said second group each being connected to said third central conductor, said shape being such that each of said N semiconductor devices of said second group are mechnaically equidistant from said Nth+1 second group conductor one end, the other end of said Nth+1 second group conductor being connected to said second central conductor.

6. The semiconductor device arrangement of claim 5 further comprising another metallic conductor one end of which is connected to said second central metallic conductor.

7. The semiconductor device arrangement of claim 6 wherein the other end of said another metallic conductor is connected to a terminal of said circuit arrangment associated with said electrode.

8. The semiconductor device arragement of claim 7 wherein said connection of said other end of said Nth+1 first group conductor and said connection of said other end of said Nth+1 second group conductor to said second group metallic conductor, said shape being such that each of said Nth+1 conductors are mechanically equidistant from said terminal.

9. The semiconductor device arrangement of claim 1 further comprising:
   (i) a second group of N+1 metallic conductors, N of which are each associated with a respective one of said N semiconductor devices, one end of each of N of said N+1 conductors being connected to the same electrode of each of said N semiconductor devices which is not the same electrode to which the one end of said N first group conductors are connected to; and
   (ii) a second central metallic conductor having a predetermined shape which is the same as said first central conductor predetermined shape, the other end of said N second group associated conductors and one end of the Nth+1 conductor of said second group N+1 conductors each being connected to said second central conductor, said shape being such that each of said N semiconductor devices are mechanically equidistant from said Nth+1 second group conductor one end.

10. The semiconductor device arrangement of claim 9 wherein the other end of said Nth+1 first group metallic conductor is connected to a terminal of said circuit arrangement associated with the same electrode to which all of said first group N conductors one end are connected to and wherein the other end of said Nth+1 second group metallic conductor is connected to a terminal of said circuit arrangment associated with the same electrode to which all of said second group N conductors one end are connected to.

11. A circuit arrangement for semiconductor devices comprising:
   (a) a plurality of groups each of said groups comprising:
      (i) N semiconductor devices wherein N is a number greater than one;
      (ii) N+1 metallic conductors, N of which are each associated with a respective one of said N semiconductor devices, one end of each of N of said N+1 conductors being connected to the same electrode of each of said N semiconductor devices; and (iii) a central metallic conductor having a predetermined shape, the other end of said N associated conductors and one end of the Nth+1 conductor of said N+1 conductors each being connected to said central conductor, said shape being such that each of said N semiconductor devices are mechanically equidistant from said Nth+1 conductor one end;

(b) another metallic conductor; and (c) another central metallic conductor having a predetermined shape, the other end of said Nth+1 conductor of each of said plurality of groups and one end of said another metallic conductor each being connected to said another central conductor, said shape being such that each of said groups are mechanically equidistant from said another conductor one end.

12. The semiconductor device circuit arrangement of claim 11 wherein the other end of said another metallic conductor is connected to a terminal of said circuit associated with said electrode.

* * * * *